United States Patent
Chladek et al.

(10) Patent No.: US 7,532,014 B2
(45) Date of Patent: May 12, 2009

(54) LRL VECTOR CALIBRATION TO THE END OF THE PROBE NEEDLES FOR NON-STANDARD PROBE CARDS FOR ATE RF TESTERS

(75) Inventors: Steffen Chladek, La Troche (FR); Martin Breinbauer, Munich (DE)

(73) Assignee: Credence Systems Corporation, Milpitas, CA (US)

( * ) Notice: Subject to any disclaimer, the term of this patent is extended or adjusted under 35 U.S.C. 154(b) by 207 days.

(21) Appl. No.: 11/463,174

(22) Filed: Aug. 8, 2006

(65) Prior Publication Data

US 2008/0036469 A1 Feb. 14, 2008

(51) Int. Cl.
*G01R 35/00* (2006.01)
*G01R 27/04* (2006.01)
*G01P 21/00* (2006.01)

(52) U.S. Cl. ..................... 324/601; 324/638
(58) Field of Classification Search .......... 324/601, 324/600, 202, 130, 638, 637, 629; 702/85
See application file for complete search history.

(56) References Cited

U.S. PATENT DOCUMENTS

| | | | | |
|---|---|---|---|---|
| 5,313,166 A | * | 5/1994 | Eul et al. | 324/601 |
| 5,440,236 A | * | 8/1995 | Schiek et al. | 324/601 |
| 5,608,330 A | * | 3/1997 | Heuermann et al. | 324/601 |
| 5,666,059 A | * | 9/1997 | Heuermann et al. | 324/601 |
| 5,861,740 A | * | 1/1999 | So | 324/74 |
| 7,068,049 B2 | * | 6/2006 | Adamian | 324/638 |
| 7,148,702 B2 | * | 12/2006 | Wong et al. | 324/650 |
| 7,375,534 B2 | * | 5/2008 | Kamitani | 324/650 |

* cited by examiner

*Primary Examiner*—Vincent Q Nguyen
*Assistant Examiner*—Hoai-An D Nguyen

(57) ABSTRACT

A method and apparatus for radio frequency vector calibration of s-parameter measurements to the tips of the wafer probe needles of an automatic test equipment production tester. The method involves a modified Line-Reflect-Line (LRL) calibration routine that uses a Thru-Reflect-Line to LRL shift to eliminate the need for a precisely characterized reflect standard used during a conventional LRL calibration. The method further involves de-embedding the non-ideal effects of the non-zero length thru standard used during the calibration routine to improve measurement accuracy of the tester. The apparatus may involve the use of RF relays to allow multiple wafer probe needles to share RF test ports.

11 Claims, 19 Drawing Sheets

(BACKGROUND)

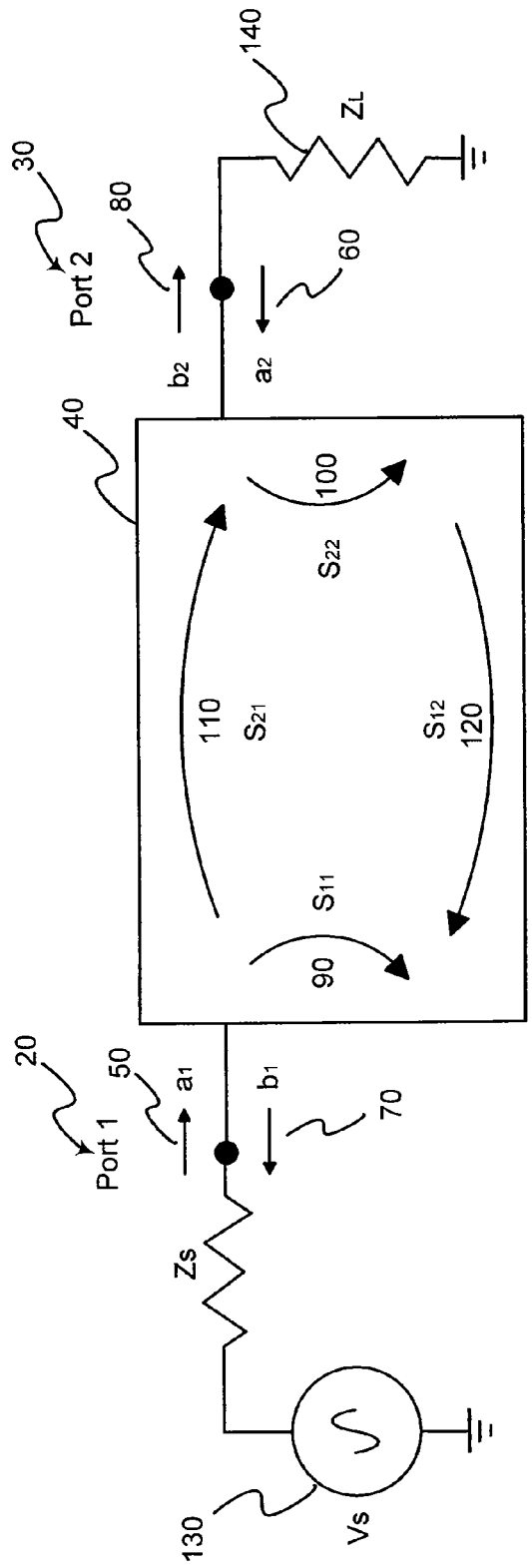

$S_{11} = \dfrac{b_1}{a_1}\bigg|_{a_2 = 0}$ = Input reflection coefficient with the output port terminated by a matched load ($Z_L = Z_o$ sets $a_2 = 0$)

$S_{22} = \dfrac{b_2}{a_2}\bigg|_{a_1 = 0}$ = Output reflection coefficient with the input port terminated by a matched load ($Z_S = Z_o$ sets $V_S = 0$)

$S_{21} = \dfrac{b_2}{a_1}\bigg|_{a_2 = 0}$ = Forward transmission (insertion) gain with the output port terminated in a matched load $S_{12} = \dfrac{b_1}{a_2}\bigg|_{a_1 = 0}$ = Reverse transmission (insertion) gain with the input port terminated in a matched load

FIG. 2 (BACKGROUND)

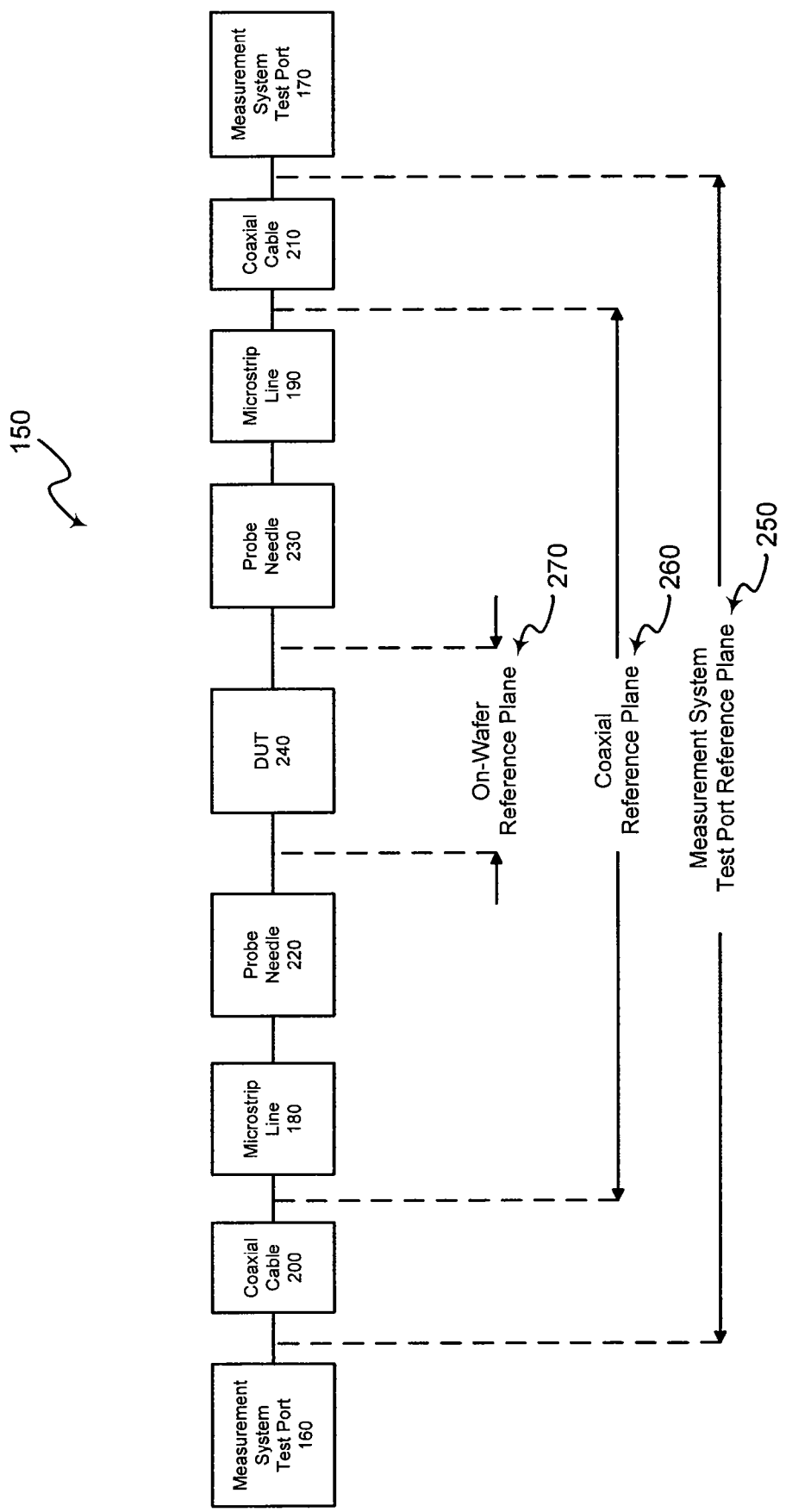
FIG. 3 (BACKGROUND)

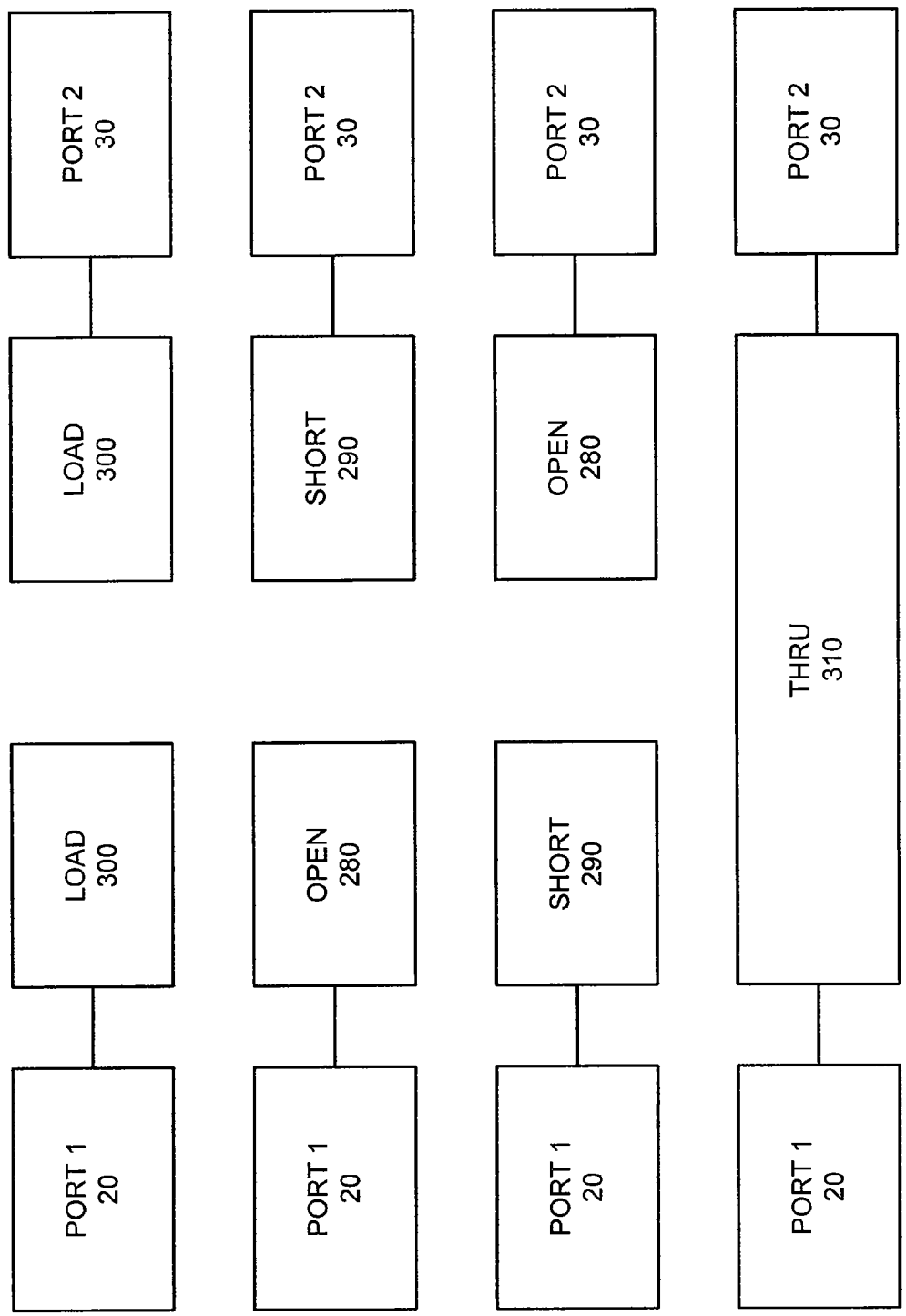
FIG. 4 (BACKGROUND)

(BACKGROUND)

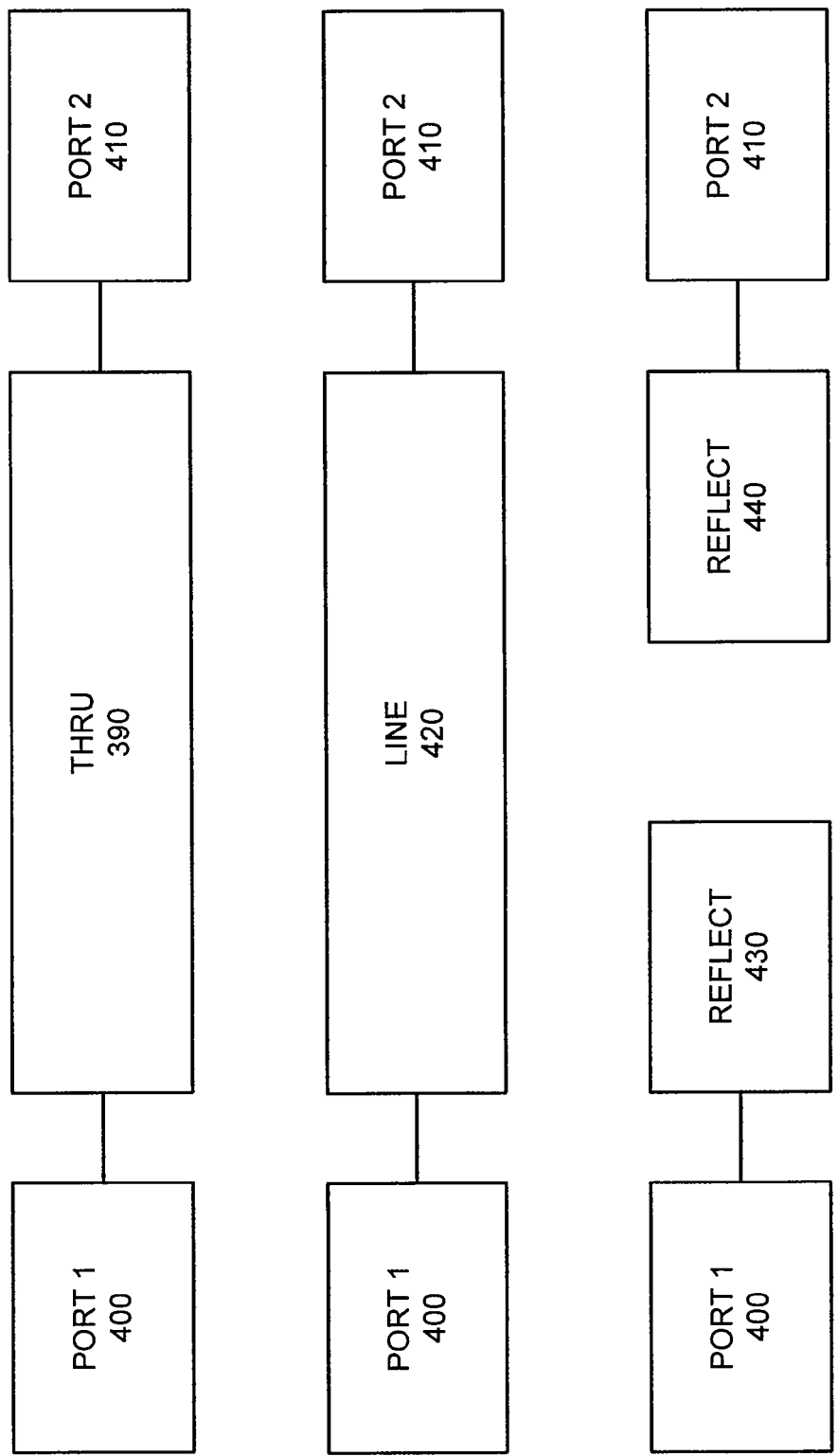
FIG. 6 (BACKGROUND)

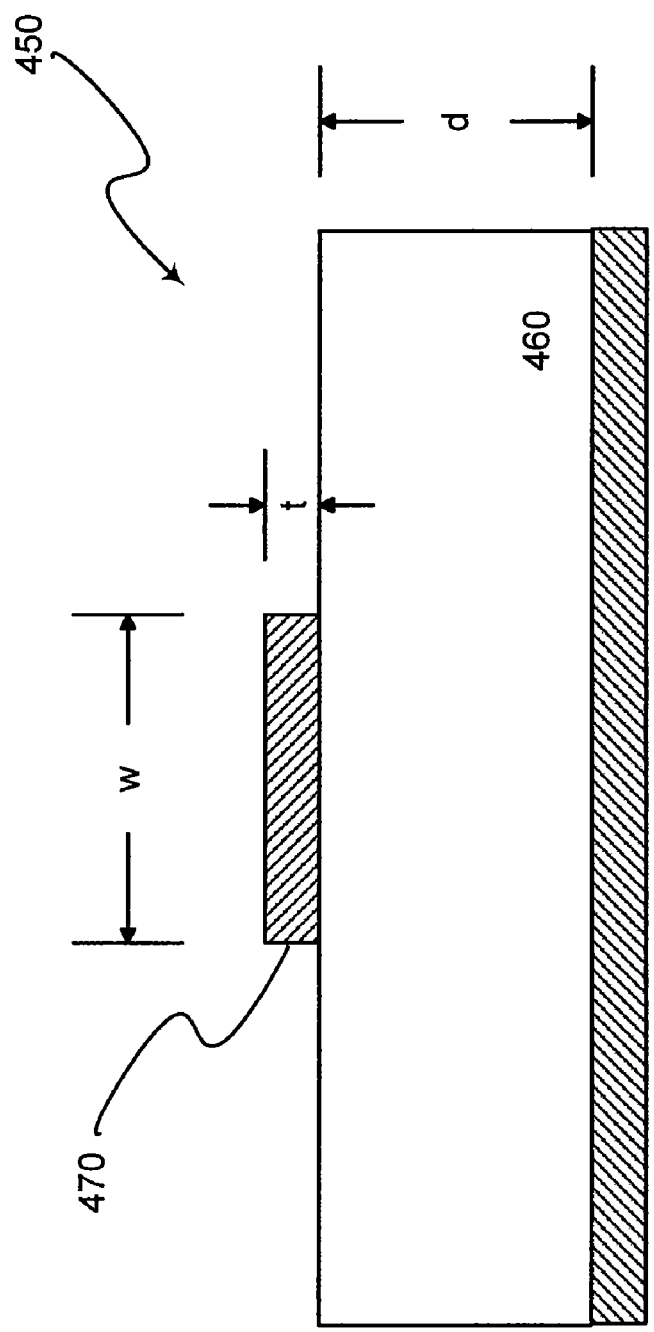
FIG. 7 (BACKGROUND)

(BACKGROUND)

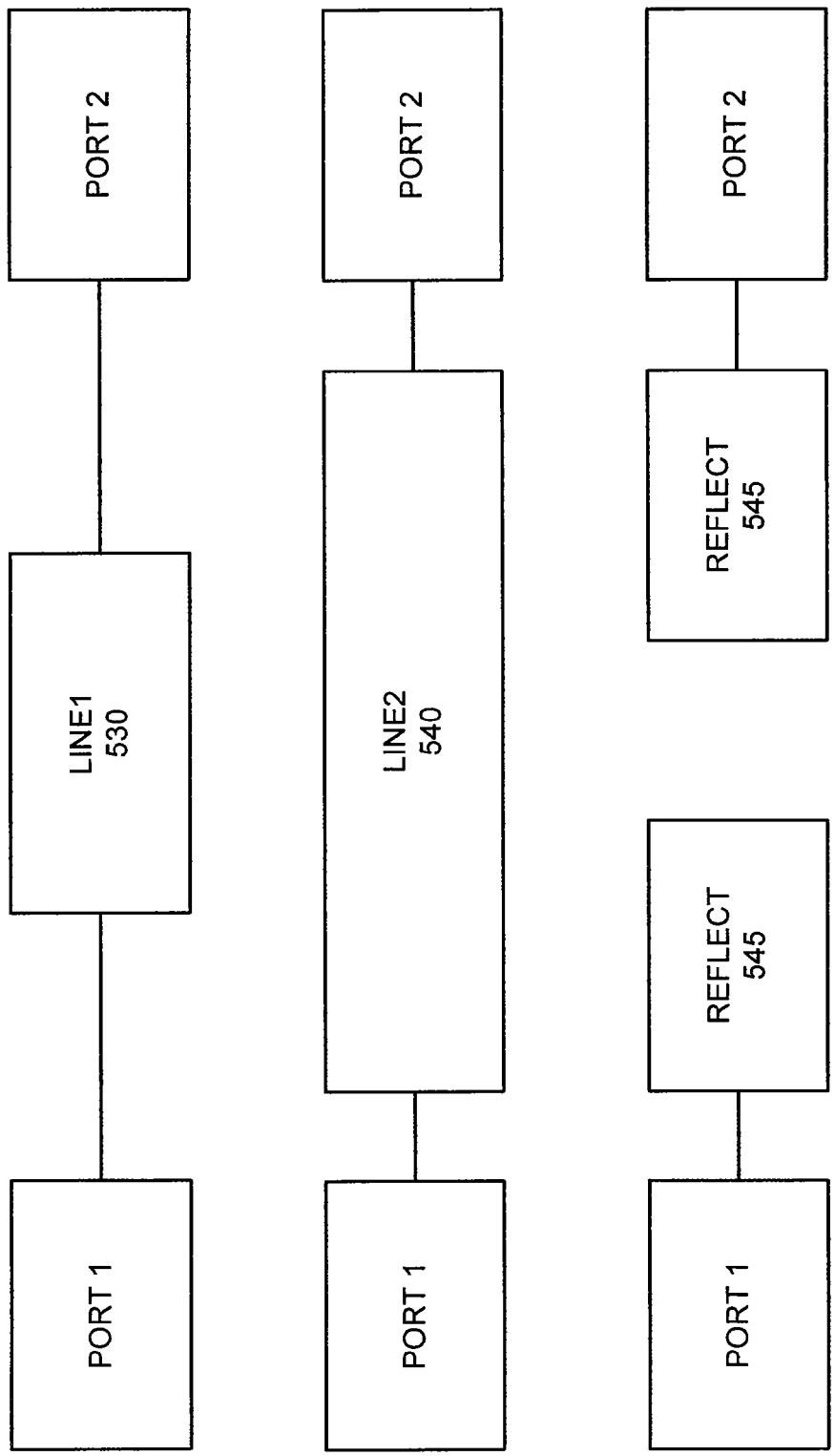
FIG. 9 (BACKGROUND)

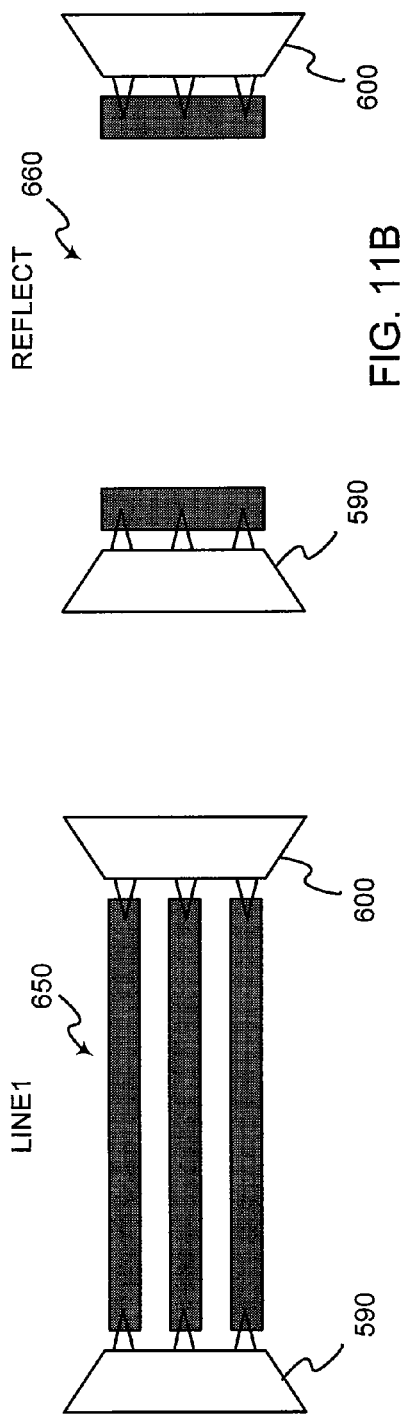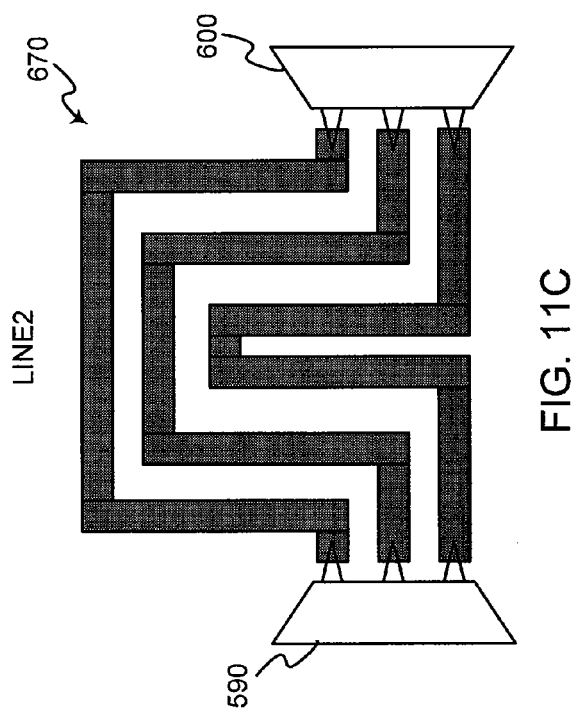

us 7,532,014 B2

LRL VECTOR CALIBRATION TO THE END OF THE PROBE NEEDLES FOR NON-STANDARD PROBE CARDS FOR ATE RF TESTERS

FIELD OF THE INVENTION

Aspects of the present invention involve an apparatus and method for radio frequency vector calibration for S-Parameter measurements, including an apparatus and method for vector calibration of an ATE production tester up to the end of the probe needles using a modified LRL (line-reflect-line) method of calibration.

BACKGROUND OF THE INVENTION

Everyday consumer products such as televisions and cellular telephones often contain integrated circuits that are configured to perform some type of electrical or processing function. These integrated circuits are fabricated on semiconductor wafers that may contain several copies of a particular integrated circuit. The wafer is processed to separate and produce individual integrated circuit "die" that then may be packaged into finished integrated circuits, often referred to as a "chip." Functionality of an integrated circuit is generally verified by testing it. Such testing may be performed at the wafer level using a set of probe needles to contact each device (on-wafer measurements made during wafer sort) or may be done after each die has been packaged.

On-wafer testing is becoming increasingly important for radio frequency (RF) integrated circuit devices, such as monolithic microwave integrated circuit (MMIC) devices. It is sometimes more cost effective to test devices at the wafer level to screen out defective devices rather than perform the testing after the devices are packaged. For on-wafer testing, the performance of a device can generally be characterized by measuring certain parameters at the device terminals (ports) without regard to what is inside the device. Referring to FIG. 1, a RF device 10 may be modeled as a two port network having an input port 20 (generally port 1) and an output port 30 (generally port 2). Such a two port network may be characterized by any of several parameter sets including y-parameters (conductance), z-parameters (resistance), h-parameters (a mixture of conductance and resistance) or s-parameters (scattering). Each parameter set involves a set of four variables associated with the two-port model. For each parameter set, two of the variables represent the excitation of the network and the other two represent the response of the network to the excitation. Each of the two-port parameter sets describe the performance of the network. However, the variables and the parameters describing their relationships are different for each parameter set. At higher frequencies such as RF, s-parameters are generally easier to measure than other kinds of parameters.

For higher frequencies such as RF, the wavelength is comparable to the dimensions of the transmission line. For such frequencies, the representation of a network using a voltage and current approach like Y, Z, and H parameters becomes dependent on the point of measurement along the transmission line. This can be avoided by using S-Parameters to represent the network. A transmission line can be any pair of wires or conductors used to transmit the traveling waves from one point to another point, usually of controlled size and contained in a controlled dielectric material to create a controlled impedance. Thus, the s-parameters of a device under test (DUT) can be measured by a measurement system located at some distance from the DUT provided that the measurement system is connected to the DUT by coaxial cables, high quality strip lines or any other suitable low-loss transmission line.

FIG. 2 is a diagram of a two-port network 40 showing incident complex voltage waves 50, 60 (a1, a2) and reflected complex voltage waves 70, 80 (b1, b2) used in s-parameter definitions. As shown in FIG. 2, s-parameters are defined by complex voltage waves 50, 60 (having both a magnitude and phase component) incident on port 1 and port 2 and complex voltage waves 70, 80 reflected from port 1 and port 2 of the two-port network 40. That is, the s-parameters 90, 100, 110 and 120 ($s_{11}$, $s_{22}$, $s_{21}$, and $s_{12}$ respectively) relate the normalized traveling waves that are scattered or reflected when a device is inserted into a transmission line. The traveling waves 50, 60, 70 and 80 are normalized to the characteristic impedance $Z_O$ of the transmission line. S-parameters involve measurements with each port of the DUT stimulated in turn. For a two port DUT the microwave source 130 power is applied to each port. This is usually accomplished by using a microwave transfer switch to connect the source 130 to each port in turn. Due to the non-ideal nature of the switch, its effect is generally included in the measurement path during calibration. S-parameter testing generally involves the measurement of the DUT's four s-parameters 90, 100, 110 and 120 to verify that they are within design tolerances.

S-parameters are typically defined with the port not being stimulated terminated in a perfect load, $Z_O$. For example, $s_{11}$ 90 (the input reflection coefficient) is equal to the ratio of the reflected wave 70 on port 1 to the input wave 50 on port 1 ($b_1/a_1$) with a perfect load 140 on port 2 ($Z_L=Z_O$). Use of a perfect load 140 makes the incident wave 60, $a_2$, on port 2 zero. Thus, the accuracy of s-parameter measurements generally depends on how good a termination is applied to the port not being stimulated.

When a DUT is connected to the test ports of the measurement system, the measured s-parameters are only accurate when the measurement system is calibrated to minimize the effects of source and load impedance mismatch. This "systematic error" often does not vary over time and can be characterized during the calibration process and removed during the measurement process through a mathematical process called error correction. Measurement system calibration may also reduce other repeatable systematic errors caused by imperfections in the test equipment, cabling, load boards and RF probe cards including directivity and crosstalk errors related to signal leakage.

FIG. 3 is a block diagram illustrating a typical s-parameter wafer testing system 150. The measurement system test ports 160, 170 are connected to microstrip lines 180, 190 on a load board using coaxial cables 200, 210. The microstrip lines 180, 190 on the load board are used to connect the coaxial cables 200, 210 to wafer probe needles 220, 230 which in turn are used to connect to the DUT 240. A challenge in s-parameter measurements is to define where the measurement system 150 ends and the DUT 240 begins (see FIG. 3). This location is called the "measurement reference plane." As shown in FIG. 3 there are multiple choices for where the measurement reference plane may be located in measurement system 150. For example, the measurement reference plane could be the defined as the Measurement System Test Port Reference Plane 250 located at the measurement system test ports 160, 170, the Coaxial Reference Plane 260 located at the ends of the coaxial cables 200, 210 or the On-Wafer Reference Plane 270 located at the ends of the probe needle tips 220, 230. However, choice of where the measurement reference plane is located is dependent on the availability of known reference standards used to calibrate the measurement system 150 that can be physically connected or inserted, preferably without the use of adaptors, at the measurement reference plane during the calibration process. This is because the calibration process involves measuring certain calibration standards of known characteristics and using these measurements to establish the measurement reference plane.

When known reference standards are available for insertion at the measurement reference plane, error contributions up to the measurement reference plane will be calibrated out. But any error contributions between the measurement reference plane and the DUT 240 become part of the measured DUT response. Ideally, the measurement reference plane should be the On-Wafer Reference Plane 270 located at the probe needle tips 220, 230 for on-wafer measurements so that just the DUT response is measured by the test system 150.

As discussed above, known reference standards are connected at the measurement reference plane during the calibration process. If adaptors are used to insert the reference standards at the measurement reference plane, the accuracy of the calibration may be degraded. This is a result of the calibration process using known calibration standards, i.e., standards that have been previously characterized, to determine the error correction as discussed below. Because adaptors are not ideal, use of them introduces additional errors that are not removed during the calibration process. For example, referring back to FIG. 3, choosing the Coaxial Reference Plane 260 as the measurement reference plane involves a set of standards that can be physically connected directly to the coaxial cables. Choosing the On-Wafer Reference Plane 270 as the measurement reference plane involves calibration standards that can be physically connected to the probe needle tips 220, 230.

There are two basic types of error correction: response calibration and vector error correction. Response calibration is a reduced error correction method, which is only used to de-embed the scalar transmission parameters $|s_{12}|$ and $|s_{21}|$ of the DUT. This is achieved by inserting a reference trace instead of the DUT 240. While response calibration is simple to perform, it removes only a few of the possible errors. Vector error correction is a more thorough method of error correction, but involves measuring phase as well as magnitude, and a set of calibration standards with known, precise electrical characteristics. The vector correction process characterizes the systematic errors by measuring known calibration standards. The difference between the measured and known responses of the standards is used to calculate an error model which is then used to remove the systematic errors from subsequent measurements.

There are several calibration methods available to do vector error correction when measuring the s-parameters of a two-port network. These include, but are not limited to Short-Open-Load-Thru (SOLT), Thru-Reflect-Line (TRL) and Line-Reflect-Line (LRL). For each of these calibration methods, specific, accurately know standards are measured during the calibration process. These calibration methods derive their names from the standards used during the calibration process.

For example, a calibration can be done at the coaxial ports 200, 210 of the measurement system 150 to remove the effects of the measurement system and any cables or adaptors that are a part of the calibration path. One of the most commonly used calibration methods for calibrating to the coaxial ports 200, 210 is the SOLT method because the characterized calibration standards are readily available. FIG. 4 shows a typical sequence of connection events for a two-port SOLT calibration. The SOLT calibration is done by making full S-Parameter measurements of the Open 280, Short 290, Load 300 and Thru 310 connected to port 1 and port 2. These measurements along with the known characteristics of the calibration standards allow the error correction for the forward direction, the source connected to port 1 with port 2 terminated, to be calculated. The error correction for the reverse direction, the source connected to port 2 with port 1 terminated, is calculated in a similar fashion.

The SOLT calibration method works well when the DUT 240 can be attached to the measurement system RF ports using the same connector types for which a precision calibration kit is available. However, if DUT 240 has non-standard connectors involving the use of adaptors or if non-standard probe cards are used to probe a device on a wafer, then it becomes more difficult to remove the effects of the measurement path from the device characteristics. This is a result of the measurement reference plane being established at the Coaxial Reference Plane 260 during the SOLT calibration procedure as shown in FIG. 3. Thus, any measurement errors caused by non-standard connectors, adaptors or probe cards inserted between the measurement reference plane and the DUT 240 are measured as part of the DUT response. That is, the measurement includes the effects (loss, phase shift, and mismatch) of the test fixture as well as the DUT response.

Additionally, the SOLT calibration method is not readily suited to calibrating s-parameter measurements made by automatic test equipment (ATE) testers during wafer sort because the calibration method involves a set of impedance standards that are not easily fabricated on the wafer. It can be difficult and costly to fabricate high quality SOLT standards on the wafer. FIG. 5 shows an example of SOLT calibration structures for calibrating ground-signal-ground (GSG) probes 320, 330 for on-wafer measurements. FIG. 5A shows the GSG probes connected to the Open structure 340 (probes in the air). FIG. 5B shows the GSG probes connected to the 50 ohm Load structure 350. FIG. 5C shows the GSG probes connected to the Short structure 360. FIG. 5D shows the GSG probes connected to the Thru structure 370.

None of these standards are ideal. For example the short structure 360 is not an ideal short, but rather behaves as an inductor at high frequencies. The open structure 340 is not an ideal open but rather behaves as a capacitor at high frequencies. In particular it is difficult to obtain a precise 50 ohm load structure 350 at high frequencies. Thus, such SOLT calibration standards are characterized prior to use. When a calibration is done using the characterized calibration standards, deviations from these known characteristics are treated as measurement system errors to be calibrated out.

Sometimes the SOLT calibration method is used during wafer sort by having the calibration standards fabricated on a separate wafer. This allows the set of reference standards to be characterized and the resistive load standard to be trimmed to its desired value, usually 50 ohms, prior to use of the standards. Prior to testing the DUT 240, the known standards are probed to calibrate the measurement system 150. This approach works well when the calibration standards are collocated with the test wafer containing the DUTs. However, this method becomes less desirable when space constraints involve swapping the test wafers and calibration standards during measurements. The SOLT calibration method is also impractical when the calibration standards are fabricated on the test wafer containing the DUTs. Here the calibration standards on each wafer need characterization to remove variations in the calibration standards from wafer to wafer. As discussed above, the precise 50 ohm load standard generally is trimmed to its desired value before use, which is impractical when the standards are fabricated on the same wafer as the DUTs.

Another method for calibrating s-parameter measurements of a two-port network is TRL. This calibration method uses thru, reflect and line calibration standards that can be implemented using transmission lines. The TRL calibration procedure involves making measurements with a Thru standard 390 connected to the test ports 400, 410, a Line standard 420 of unknown propagation constant but of known $Z_O$ connected to the test ports, and unknown high Reflect standards 430, 440 (open or short) connected to each of the test ports as shown in FIG. 6. The primary constraints when using this calibration technique are that the system impedance be equal to the characteristic impedance of the Line standard 420 and the reflect standards 430, 440 need to be the same on both test ports 400, 410. When a TRL calibration is performed, the reference plane is established at the middle of the Thru, which for a zero length Thru, is the DUT reference plane. However, in a wafer probing situation, the probe needles generally cannot be moved making it impossible to realize a zero length Thru 390 when the TRL standards are implemented on a wafer.

The TRL reference standards are more suitable than SOLT standards for fabrication on a non-coaxial media such as a semiconductor wafer because the TRL standards can be implemented with microstrips. FIG. 7 shows an example of a microstrip 450. The microstrip can be fabricated on a semiconductor wafer 460 by depositing a metal layer 470 on the surface of the wafer which is then etched to define the width of the microstrip. The impedance of the microstrip is determined by its geometry factor (w/t) and the relative permittivity constant of the semiconductor wafer (E) as is known to those skilled in the art.

FIG. 8 provides an example of TRL calibration standards implemented with microstrips. FIG. 8A shows a Thru structure 480 connected to the probes 490, 500. FIG. 8B shows a Reflect structure 510 connected to the probes 490, 500. FIG. 8C shows a Line structure 520 connected to the probes 490, 500. As shown in FIG. 8A, one of the standards used during the TRL calibration process is a Thru standard 480. This standard is generally implemented as a zero length line. Such a standard does not exist for on-wafer measurements because wafer probe needles 490, 500 often are rigid with a fixed spacing between the needles. As such, they cannot be directly connected to each other using a zero length thru standard. Rather, as shown in FIG. 8A, the Thru structure 480 can be implemented using microstrips with a non-zero length.

LRL is an alternative calibration method related to TRL. The calibration standards needed for LRL are two different line lengths, Line1 and Line2 standards 530, 540, and a Reflect standard 545 (usually an open or a short) as shown in FIG. 9. When the LRL calibration method is used, the reference plane is established by the reflect standard 545. Because the reflect standard 545 is used to establish the reference plane, it needs to be precisely characterized. This again presents problems when the standards are implemented on the same wafer as the DUT instead of on a fully characterized separate calibration wafer. Additionally, LRL is not suitable for calibrating probe cards with fixed spacing probe needles because LRL involves an undesirable change of probe-probe spacing during calibration to measure the longer line, usually Line2 standard 540.

What is needed is a calibration method that accounts for all the errors up to the device under test. That is, a method that establishes the reference plane at the DUT using calibration standards that are not precisely characterized. What is further needed is a calibration method that utilizes standards easily fabricated on a wafer and which can be used to calibrate fixed spacing probe cards. What is also needed is a method of calibration that supports the assignment of several calibration correction sets to a single RF measurement port to allow accurate measurement of several RF DUT pins that are connected to the RF port of the measurement system using a RF relay.

SUMMARY

One aspect of the present invention involves a method for radio frequency vector calibration of an ATE production tester including a plurality of wafer probe needles, each wafer probe needle including a tip. The calibration method comprises obtaining at least two calibration standards, each having an initially unspecified complex propagation constant and each having a different geometric length. The method further involves measuring a delay value and a loss value of each calibration standard and determining the complex propagation constant of each calibration standard. Finally, the method involves establishing a reference plane at the tips of the wafer probe needles. The method may further involve performing a Thru-Reflect-Line calibration at the wafer probe needles using a non-zero length thru calibration standard having a middle region and a line calibration standard to set the reference plane to the middle region of the non-zero length thru. The method may then involve determining an attenuation constant and phase constant of the non-zero length thru and shifting the reference plane to the tips of the wafer probe needles based only on the knowledge of the geometrical lengths of the calibration standards used.

Another aspect of the present invention involves an apparatus for sharing RF measurement ports among multiple wafer probe needles. The apparatus includes an ATE production tester including a test head having at least two RF measurement ports and a plurality of wafer probe needles. The apparatus also includes at least one RF relay with an input port, at least two output ports and a plurality of relay states. The input port of the at least one RF relay is operably connected to one of the at least two measurement ports and each of the at least two output ports of the relay is operably connected to one of the plurality of wafer probe needles.

Another aspect of the present invention involves an apparatus for performing calibrated DUT measurements on an ATE production tester comprising a test head having at least two RF measurement ports and a load board having a plurality of wafer probe needles, each probe needle having a tip, operably connected to the test head and the DUT. The apparatus comprises the tester and a set of calibration standards. The tester is calibrated to the tips of the wafer probe needles by way of obtaining at least two calibration standards, each having an initially unspecified complex propagation constant and each having a different geometric length. The calibration further involves measuring a delay value and a loss value of each calibration standard and determining the complex propagation constant of each calibration standard. And finally, the calibration involves establishing a reference plane at the tips of the wafer probe needles.

BRIEF DESCRIPTION OF THE DRAWINGS

FIG. 2 is a block diagram of a two-port network showing the s-parameters of the two-port network.

FIG. 3 is a block diagram of a wafer test system.

FIG. 4 depicts the sequence of connection events for a two-port SOLT calibration.

FIG. 6 depicts the sequence of connection events for a TRL calibration.

FIG. 7 is a diagram of a microstrip line implemented on a semiconductor wafer.

FIG. 9 depicts the sequence of connection events for a LRL calibration.

FIG. 11A depicts the LRL LINE1 structure for calibrating GSM probes.

FIG. 11B depicts the LRL REFLECT structure for calibrating GSM probes.

FIG. 11C depicts the LRL LINE2 structure for calibrating GSM probes.

DETAILED DESCRIPTION OF EMBODIMENTS OF THE INVENTION

One aspect of the present invention involves a method for calibrating automatic test equipment having non-standard probe needles to optimize measurement of the s-parameters of the device under test (DUT). In one particular arrangement, the method involves a vector calibration using calibration standards fabricated on the semiconductor wafer containing the devices to be tested. The method further involves a Thru-Reflect-Line (TRL) to Line-Reflect-Line (LRL) shift to eliminate precise characterization of a reflect standard as is generally needed by conventional LRL calibration methods.

Figure 10:
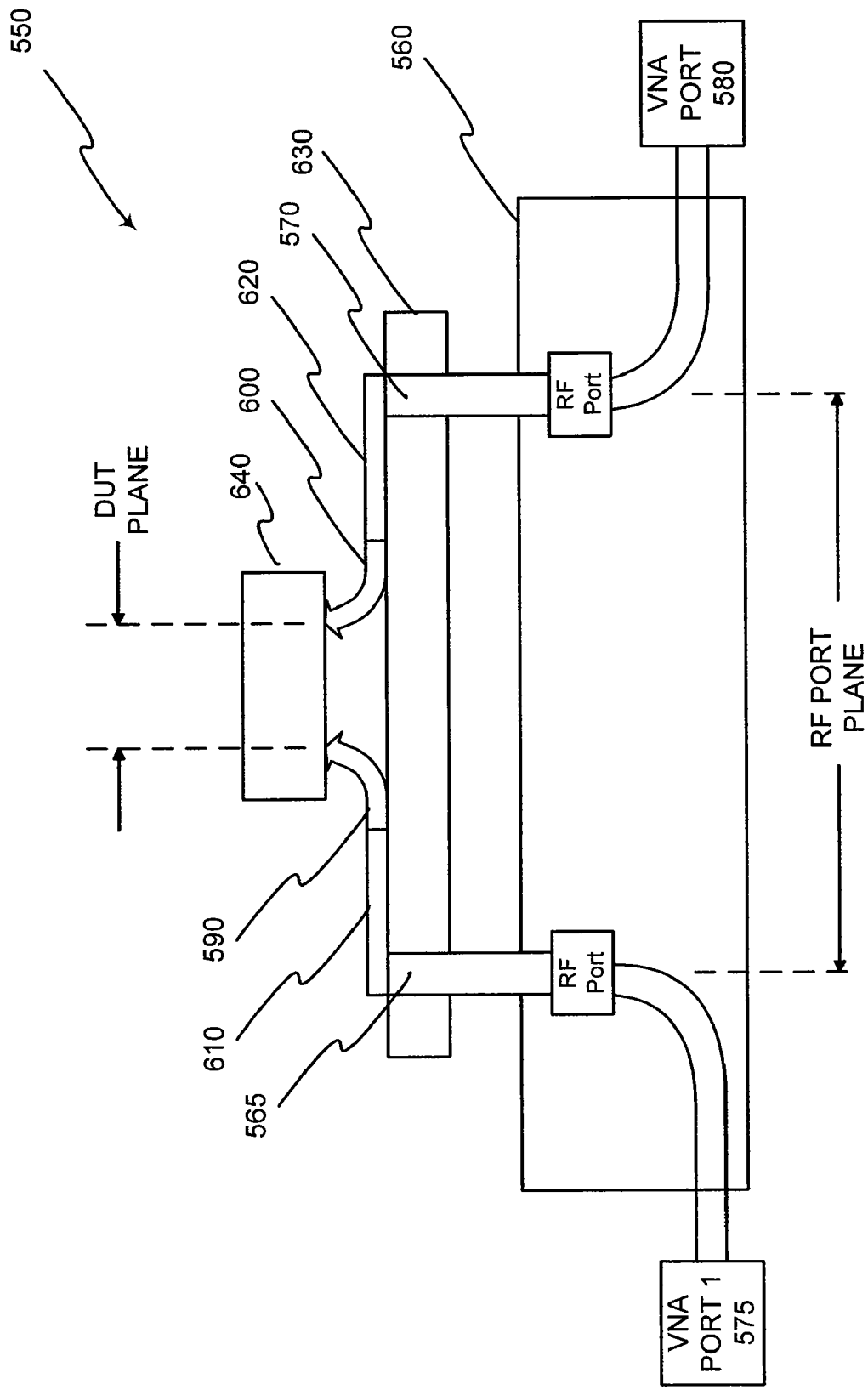
FIG. 10 is a block diagram of an RF ATE production tester.

FIG. 10 depicts an automatic test equipment (ATE) production tester 550 with a test head 560 having radio frequency (RF) measurement ports 565, 570 in communication with vector network analyzer (VNA) ports 575, 580. The RF ports 565, 570 are connected to wafer probe needles 590, 600 via microstrip lines 610, 620 fabricated on a load board 630. The probe needles make contact with the DUT 640 during testing or with the calibration standards during calibration. The DUT 640 may be one of several contained on a silicon wafer. The wafer may also have calibration standards fabricated on it.

Figure 1:
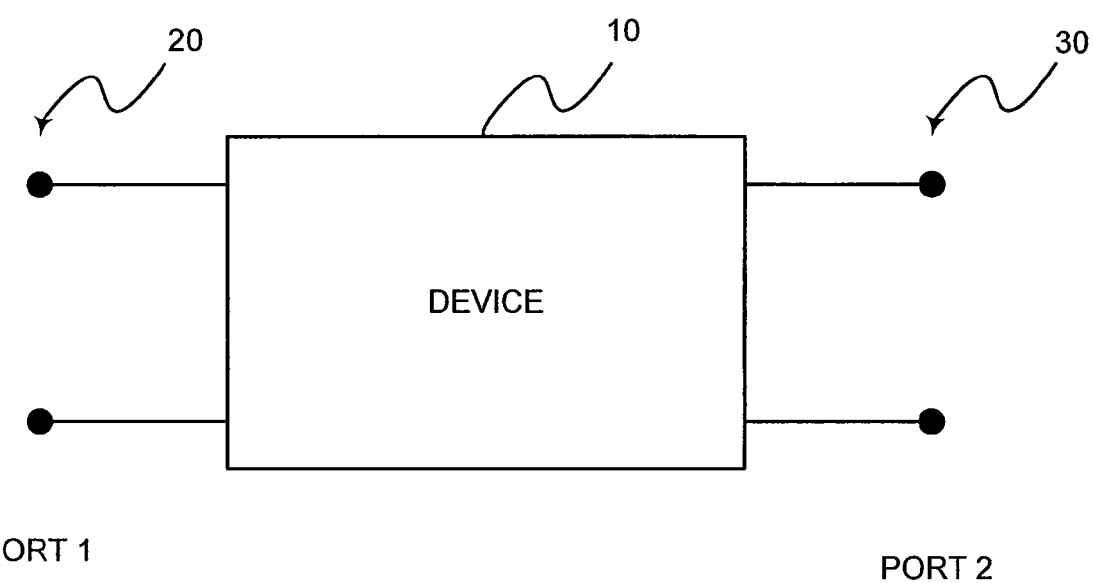
FIG. 1 is a block diagram of a device modeled as a two-port network.
Figure 5B:
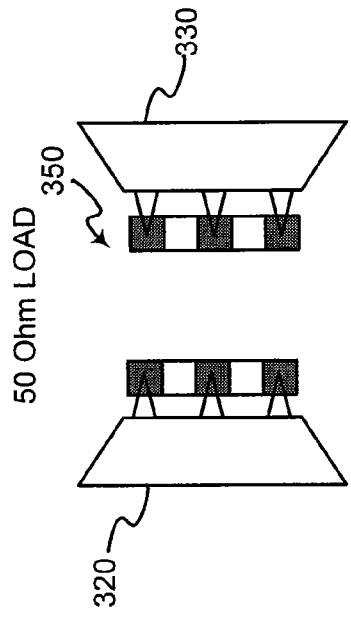
FIG. 5B is a diagram of an SOLT 50 Ohm LOAD structure to calibrate GSM wafer probes.
Figure 5D:
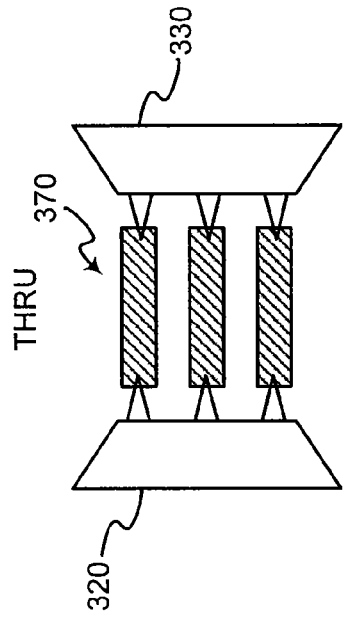
FIG. 5D is a diagram of an SOLT THRU structure to calibrate GSM wafer probes.
Figure 5A:
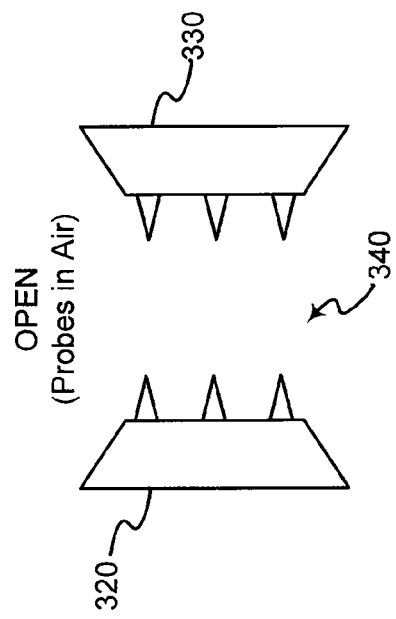
FIG. 5A is a diagram of an SOLT OPEN structure to calibrate GSM wafer probes.
Figure 5C:
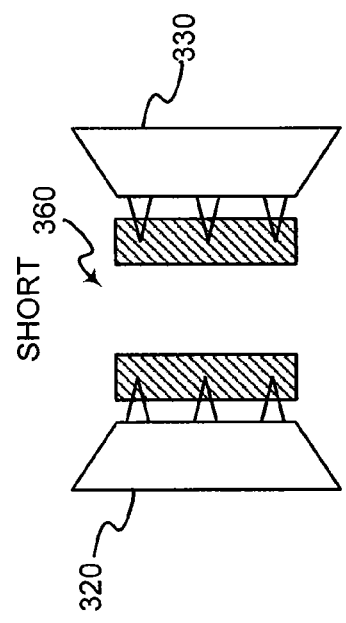
FIG. 5C is a diagram of an SOLT SHORT structure to calibrate GSM wafer probes.
Figure 8C:
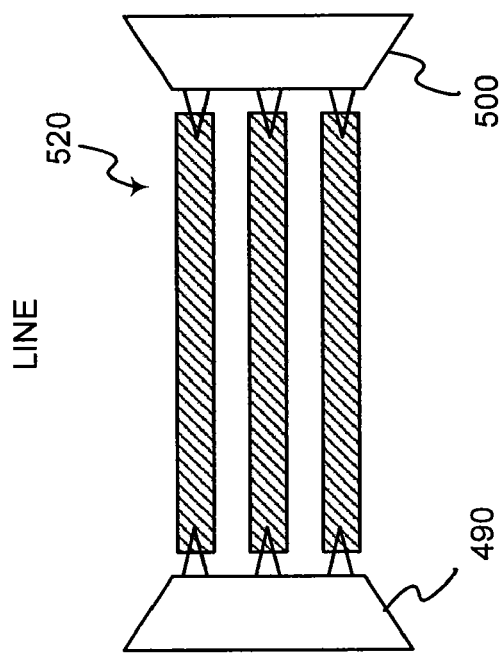
FIG. 8C is a diagram of a TRL LINE structure to calibrate GSM probes.
Figure 8B:
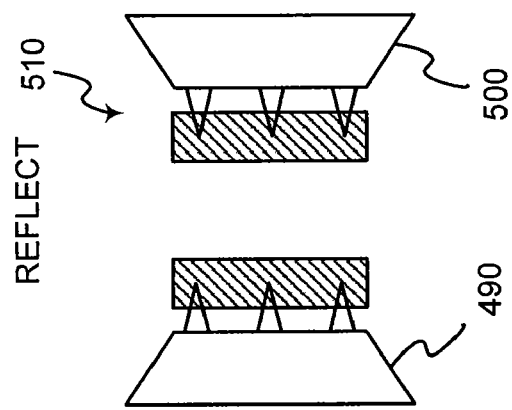
FIG. 8B is a diagram of a TRL REFLECT structure to calibrate GSM probes.
Figure 8A:
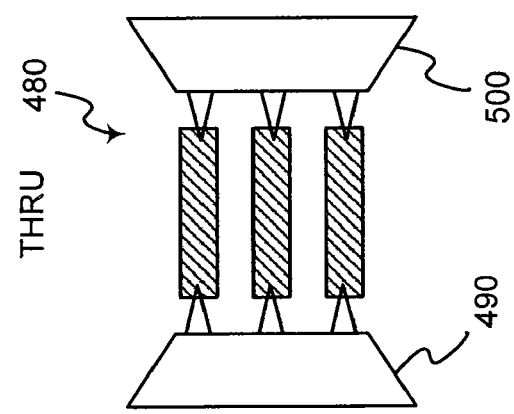
FIG. 8A is a diagram of a TRL THRU structure to calibrate GSM probes.

Unlike FIGS. 5 and 8, FIG. 11 shows one way to fabricate a set of LRL calibration structures on a silicon wafer that are used by one embodiment to calibrate ATE production tester 550 to the probe needles 590, 600 that does not involve a change in probe needle spacing when the calibration structures are probed. FIG. 11A shows a Line1 Structure 650. FIG. 11B shows a Reflect standard 660 and FIG. 11C shows a Line2 standard 670 of different length than Line1 structure 650. In one particular arrangement, the tester 550 is calibrated to the tips of the probe needles, i.e., to the point of contact with the wafer. Because the probe needles 590, 600 are of fixed spacing, the Line1 calibration standard 650, as shown in FIG. 11A, is fabricated with a microstrip of length equal to the spacing between the probe needles while the Line2 calibration standard 670, as shown in FIG. 11C, is fabricated with a longer microstrip that also has the spacing of its endpoints equal to the spacing between the probe needles. This is accomplished by fabricating Line2 with bends rather than as a straight line. The Reflect standard structure 660, as shown in FIG. 11B, is implemented using shorts.

As previously noted, the measurement system 550 and the Line1 and Line2 calibration standards, 650 and 670, respectively, should have the same characteristic impedance. Most RF measurement systems generally have a characteristic impedance of 50 ohms. The following equation gives the characteristic impedance of a microstrip:

$$Z_0 = 60*\ln(8h/w + w/(4h))/SQRT(\in_{eff}) \text{ if } w/h<1, \text{ otherwise}$$

$$Z_0 = 120*\pi/((w/h + 1.393 + 0.677*\ln(w/h + 1.444))*SQRT(\in_{eff}))$$

where $$\in_{eff} = ((\in_r + 1)/2 + (\in_r - 1)/2)/SQRT(1 + (12*h)/w)$$

h=substrate thickness w=width of the microstrip $\in_r$=relative permittivity of the substrate.

This enables the width of the microstrip to be chosen to provide a 50 ohm characteristic impedance for a given thickness and relative permittivity of the wafer substrate on which the standards are fabricated.

As indicated above, the Line2 standard 670 is fabricated with bends. Such bends can affect the electrical length of Line2 and also its characteristic impedance, which defines the reference impedance of the calibration procedure. As previously indicated, this characteristic impedance should be 50 ohms. If the characteristic impedance of Line2 is not about 50 ohms, a simple calculation after the de-embedding procedure can be done to adjust the characteristic impedance of the calibration matrices:

$$S' = P^{-1}(S - \gamma)(I - \gamma)^{-1} P$$

with $$P_{ii} = \sqrt{\frac{\mathrm{Re}(A_{ii})}{\mathrm{Re}(B_{ii})}} \left|\frac{B_{ii}}{A_{ii}}\right| \left|\frac{2A_{ii}}{A_{ii} + B_{ii}}\right|$$

and $$\gamma_{ii} = \frac{B_{ii} - A_{ii}}{B_{ii} + A_{ii}}$$

$A_{ii}$ and $B_{ii}$ are the reference impedances of the single ports of S [$A_{ii}$] and S' [$B_{ii}$]. I is the unity matrix.

In typical applications, the effects of bending the line can be controlled through design such that their impact on measurement results can generally be ignored.

The phase shift of a lossless microstrip is a function of its length, l, and measurement frequency, f, as given by the following equation:

Phase Shift=$(2*\pi*f/c)*l$ where $c$=speed of light on the microstrip line.

The frequency dependence of the phase shift of the microstrip involves a difference in length of the Line1 and Line2 standards, 650 and 670. The target is to provide a phase shift difference of between 20 degrees and 160 degrees. Such a condition is imposed to ensure a unique solution to the mathematical equations that compute the calibration correction factors used to de-embed the effects of Line1 standard 650, as discussed below. Having to satisfy this condition limits the frequency range over which the LRL calibration method can be used. That is, LRL is a narrowband calibration method. For most applications, this does not present problems because the device being tested also has a limited frequency range over which it works. Thus, knowing the frequency range of interest allows the lengths of the Line1 and Line2 standards, 650 and 670, respectively, to be properly chosen to calibrate the tester over the range of frequencies of interest.

Figure 12:
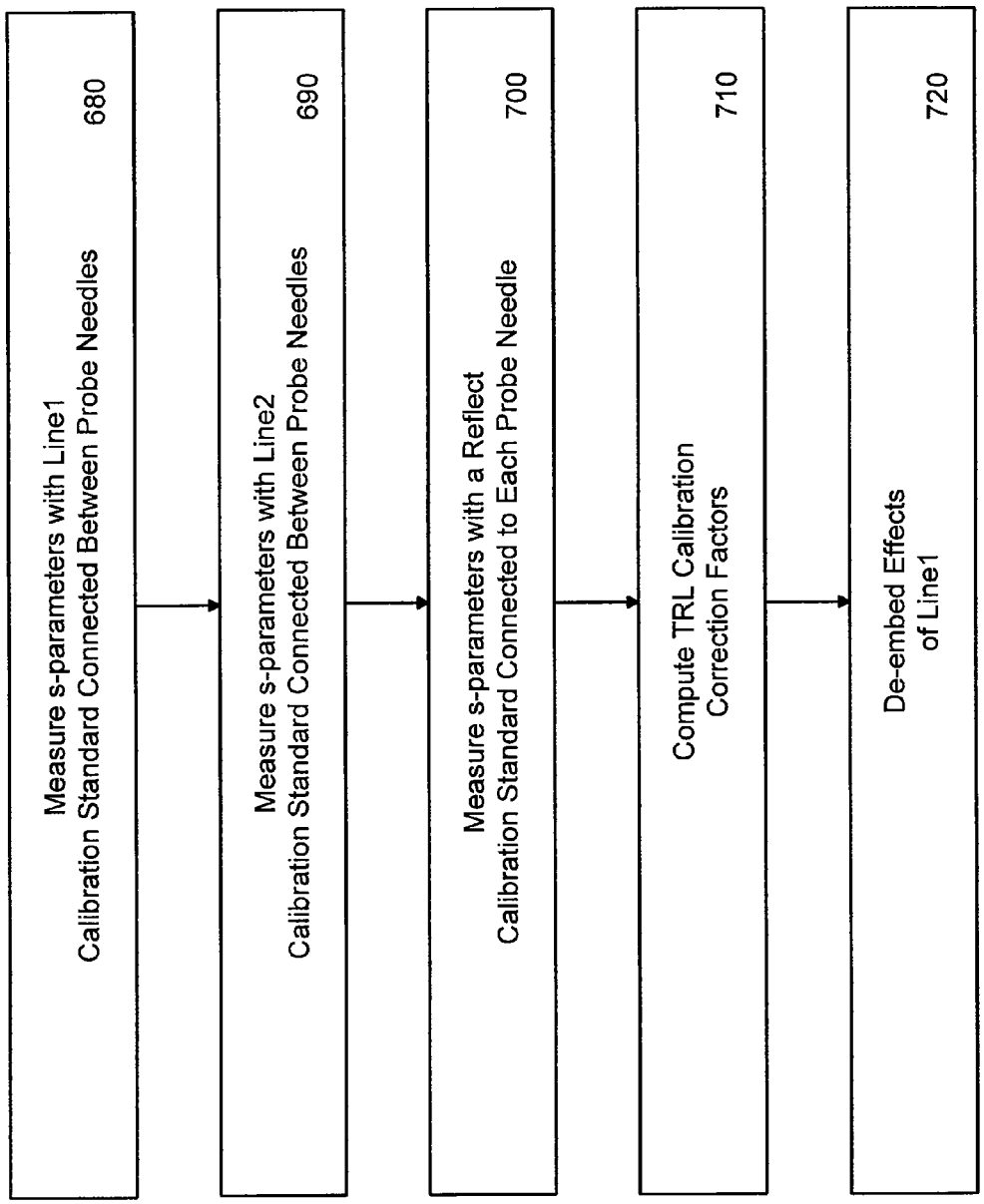
FIG. 12 is a flowchart illustrating the operations of an RF vector calibration of an ATE tester, in accordance with one embodiment of the present invention.

FIG. 12 is a flowchart illustrating the operations of a vector calibration performed in accordance with one embodiment of the invention to calibrate the ATE production tester to the tips of the probe needles. The method illustrated in FIG. 12 flowchart may also be implemented as executable software code. The code may be adapted to run on a workstation connected to the ATE production tester, run on a server connected to a network accessible by one or more processing devices, and on a standalone processing device (such as a personal computer, workstation, or the like). The code may also be recorded on a computer readable medium, such as a floppy disk, CD-ROM, RAM, ROM, and the like.

Referring again to FIG. 12, when a calibration is performed, the ATE production tester measures the s-parameters with the Line1 calibration standard 650 (see FIG. 11A) connected to the probe needles (operation 680). The tester then measures the s-parameters with the Line2 standard 670 (see FIG. 11C) connected to the probe needles (operation 690). Next, the tester measures the s-parameters with the Reflect standard 660 (see FIG. 11B) connected to the probe needles (operation 700). Once the s-parameters have been measured using the three calibration standards, calibration correction factors are computed (operation 710) and the effects of Line1 are de-embedded (operation 720), both as described in more detail below.

Figure 13:
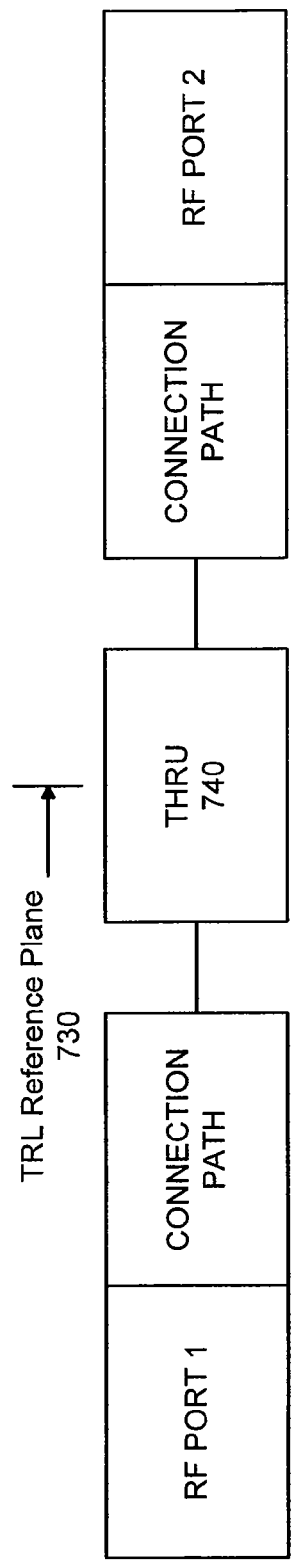
FIG. 13 depicts where the reference plane is established for a TRL calibration.
Figure 14:
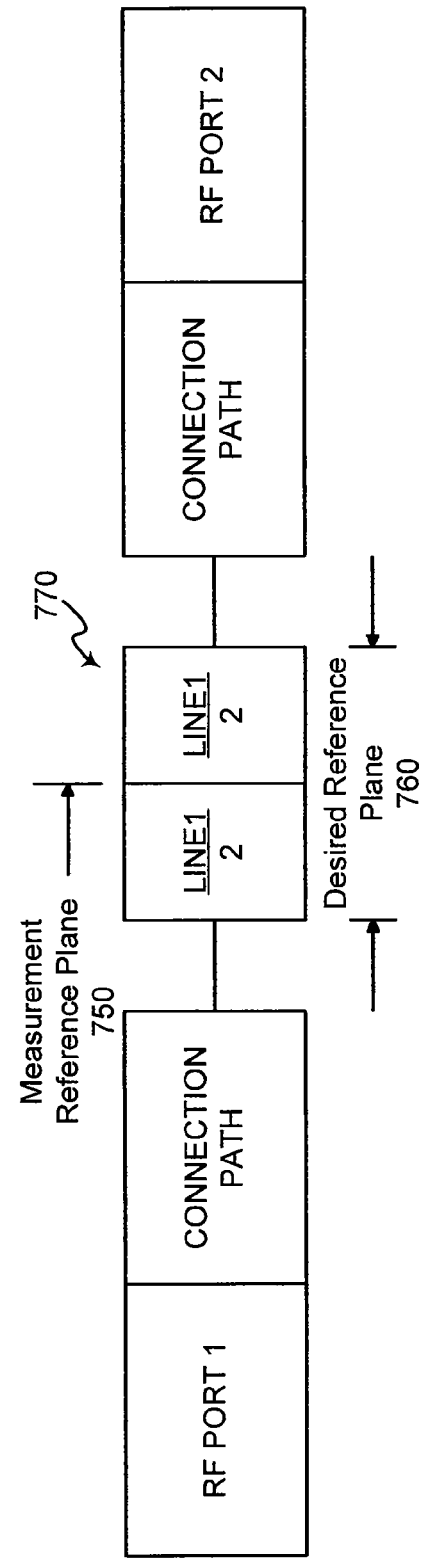
FIG. 14 depicts where the reference plane is established for a TRL calibration using a non-zero length LINE1 standard instead of a THRU standard.

When the calibration correction factors are computed, the correction routine initially assumes that a TRL vector calibration is performed even though a set of LRL calibration standards are measured. A TRL calibration is assumed rather than performing a conventional LRL calibration to avoid the need for characterized reflect standards used during such a calibration. During a TRL calibration, a Thru 740 is used to establish the measurement reference plane 730 at the middle of the Thru 740 as depicted in FIG. 13. For a zero-length Thru, this results in the measurement reference plane at the DUT as desired because no phase shift or magnitude loss is introduced into the measurement path by the zero-length Thru. However, because a Line1 calibration standard 770 of finite length is used instead of a zero length Thru, the measurement reference plane 750 is established at the middle of Line1 as shown in FIG. 14 rather than at the edges of Line1, the desired reference plane 760, where the DUT is connected.

During the computation of the calibration correction factors, there are two possible solutions to the equations. To determine the correct solution, a trial de-embedding is performed to determine which solution leads to feasible results. Only this solution is used in subsequent calculations.

The non-ideal behavior of Line1 standard 770 becomes part of the DUT response unless its effects are removed by a process called de-embedding. De-embedding the non-ideal behavior of Line1 standard 770 results in the measurement reference plane being shifted to the edges of Line1, the desired DUT reference plane 760. In the de-embedding calculation for Line1 standard 770, the geometrical lengths of Line1 and Line2 need to be known. Other information to de-embed Line1 is obtained from the calibration measurements performed using the standards. This means that characterized standards are not needed for this calibration technique. The geometrical lengths of Line1 and Line2 can be controlled using good design techniques and manufacturing processes.

Referring back to FIG. 11, the measured s-parameters of Line1 and Line2 standards 650, 670 provide sufficient information to shift the measurement reference plane to the edges of the Line1 standard 650 which is the desired DUT reference plane. Recalling that in one embodiment of the invention the calibration standards are implemented using microstrips, the phase constant β is given by the following equation:

$\beta = 2*\pi*f/c$ where f=frequency of the measurement and c=speed of light on the microstrip line.

Alternatively, because the phase constant defines the phase shift per geometrical length in degrees per meter, β can also be calculated as follows:

β=Δphase/Δlength, where Δ phase is difference in the measured phase responses of Line1 standard 650 and Line2 standard 670 and Δ length is the difference in the geometrical lengths of Line1 and Line2 standards which is known from the design of Line1 and Line2 standards on the wafer.

The attenuation constant, α, defines the attenuation of the microstrip per geometrical length in dB per meter and can be calculated as follows:

α=Δmagnitude/Δlength, where Δ magnitude is the difference in the measured magnitude responses of Line1 standard 650 and Line2 standard 670 and Δ length is the difference in the geometrical lengths of Line1 and Line2 standards.

The above calculations provide the information needed to determine the complex propagation constant, k, of the microstrip as follows:

$$k = \alpha + j*\beta.$$

The geometric design and material parameters of the microstrip Line1 and Line2 standards 650, 670 determine the propagation constant which is assumed to be the same for both the shorter and the longer line standards, Line1 and Line2, respectively.

Given that the geometrical length of Line1 standard 650 is known from design and the propagation constant k has been determined by measurements, the electrical length in degrees and the loss in dB of Line1 standard can be calculated as follows:

Phase=$\beta$*geometrical length of Line1 standard

Loss=$\alpha$*geometrical length of Line1 standard

Half of this phase and loss are used to shift the reference plane from the middle of Line1 standard 650 to its edges. This de-embeds the effects of Line1 standard on DUT measurements by locating the reference plane at the probe needle tips where the DUT is attached during measurements.

Figure 15:
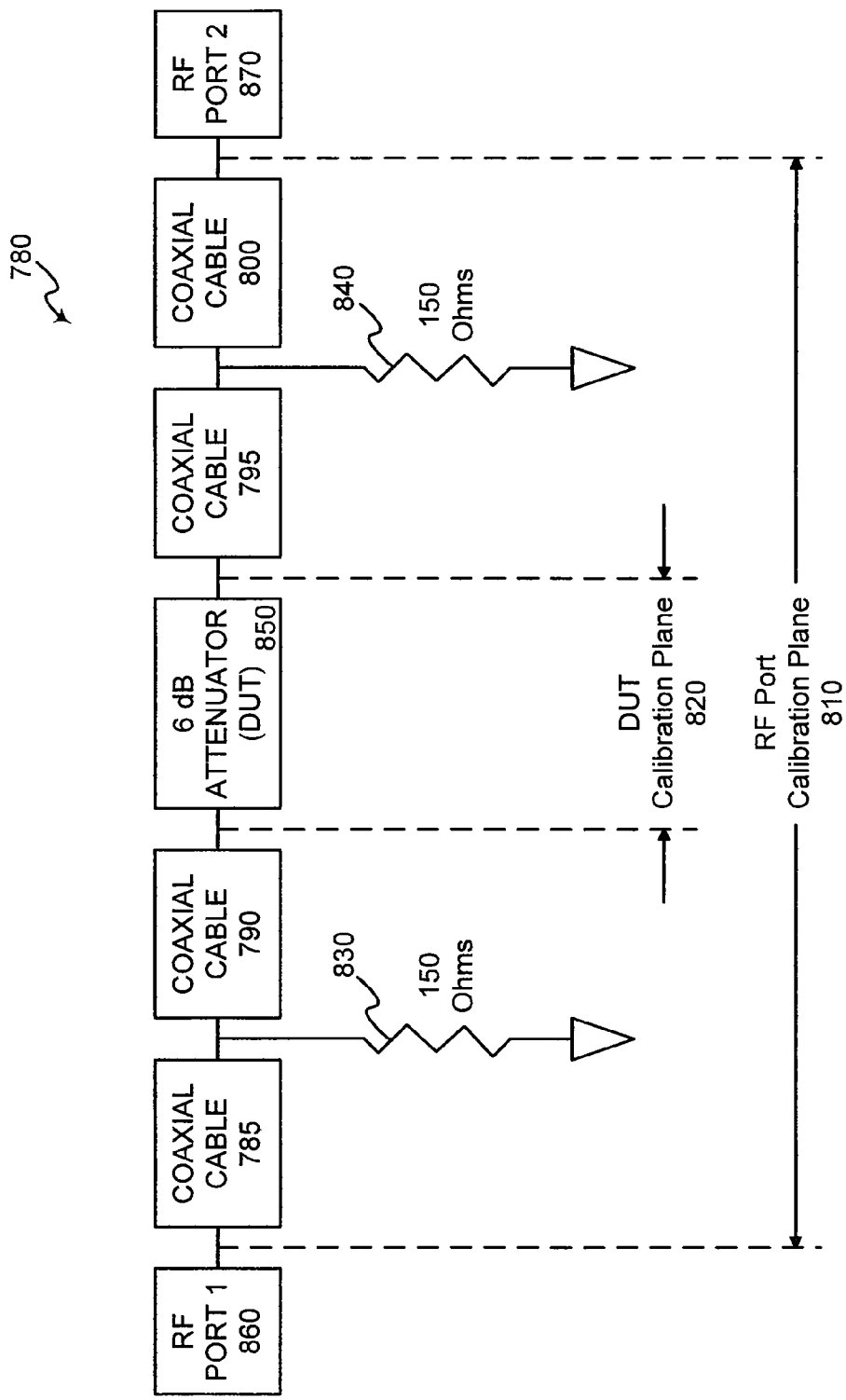
FIG. 15 is a block diagram of a measurement system to verify the modified LRL calibration procedure of one embodiment of the present invention.

FIG. 15 shows a measurement setup 780 used to validate the modified LRL method of one aspect of the present invention. Standard 50 ohm coaxial cables 785, 790, 795, 800, for which a SOLT calibration kit is available, are used to enable SOLT calibrations at the RF Port calibration plane 810 as well as at the DUT calibration plane 820. A LRL calibration kit is also available to enable the modified LRL calibration to be performed at the DUT calibration plane. Mismatches in the measurement path have been introduced by the insertion of 150 ohm resistors 830, 840 to ground. These mismatches are representative of the systematic errors that are to be removed during the vector calibration process. A vector network analyzer (VNA) is connected to the DUT 850, a 6 dB attenuator, via RF Port1 860 and RF Port2 870.

Figure 16:
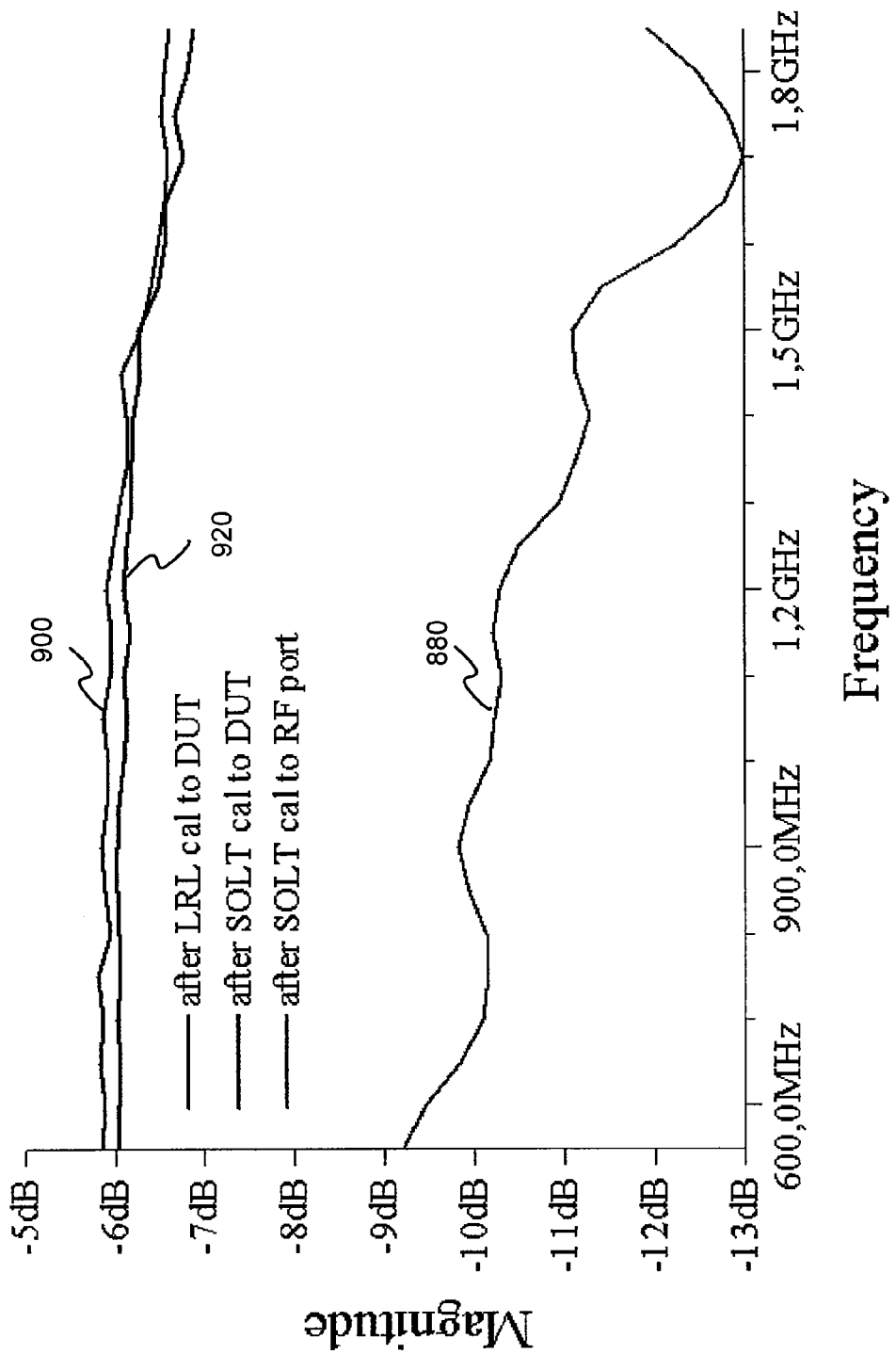
FIG. 16 is the measured $s_{21}$ magnitude response of the measurement system of FIG. 15 after SOLT calibration to the RF ports, after SOLT calibration to the DUT and after LRL calibration to the DUT.
Figure 17:
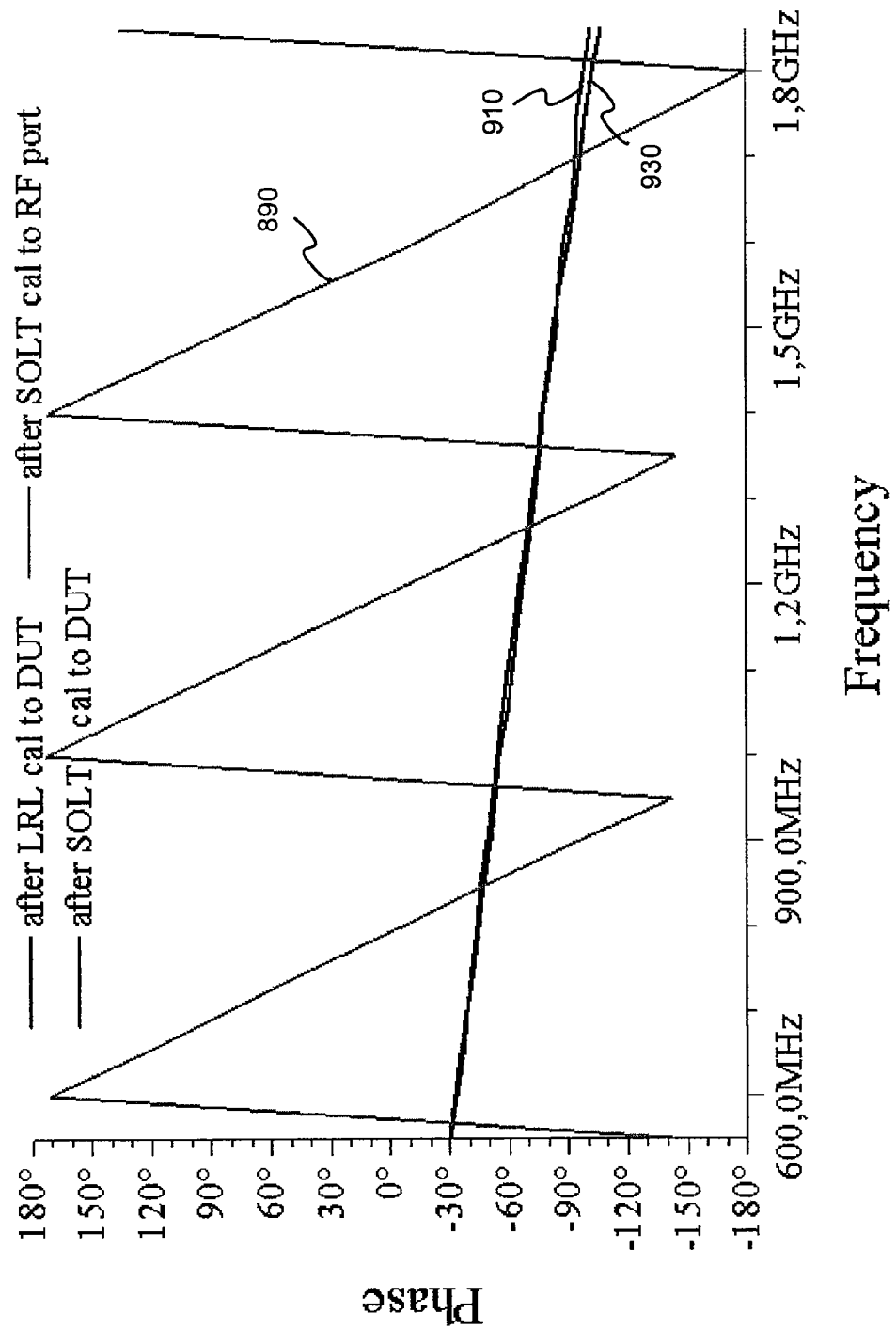
FIG. 17 is the measured S21 phase response of the measurement system of FIG. 15 after SOLT calibration to the RF ports, after SOLT calibration to the DUT and after LRL calibration to the DUT.

Shown in FIGS. 16 and 17 are the magnitude and phase, respectively, of the $s_{21}$ of the DUT over a frequency range of 600 MHz to 1.8 GHz. Graphs 880 and 890 depict the magnitude and phase of $s_{21}$ after a standard SOLT calibration has been performed at the RF ports. Graphs 900 and 910 depict the magnitude and phase of $s_{21}$ after a SOLT calibration has been performed at the DUT. Graphs 920 and 930 depict the magnitude and phase of $s_{21}$ after the modified LRL calibration routine of one embodiment of the invention has been performed at the DUT. As can be seen by comparing Graphs 920 and 930 with 880 and 890, the measured magnitude and phase of $s_{21}$ after the modified LRL calibration routine has been performed at the DUT compares very favorably to the measured magnitude and phase of $s_{21}$ after a SOLT calibration at the DUT has been performed.

Figure 18:
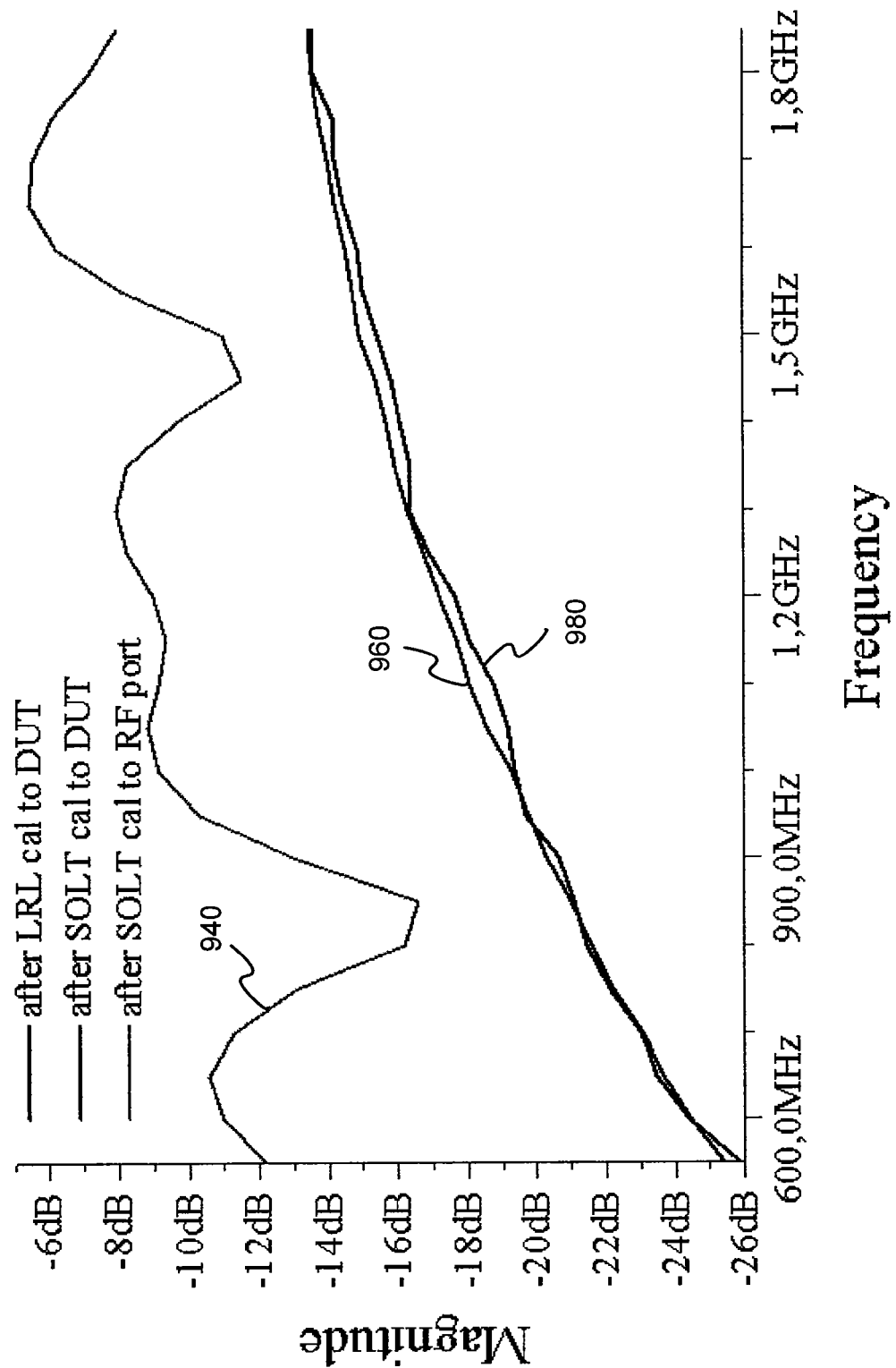
FIG. 18 is the measured $s_{11}$ magnitude response of the measurement system of FIG. 15 after SOLT calibration to the RF ports, after SOLT calibration to the DUT and after LRL calibration to the DUT.
Figure 19:
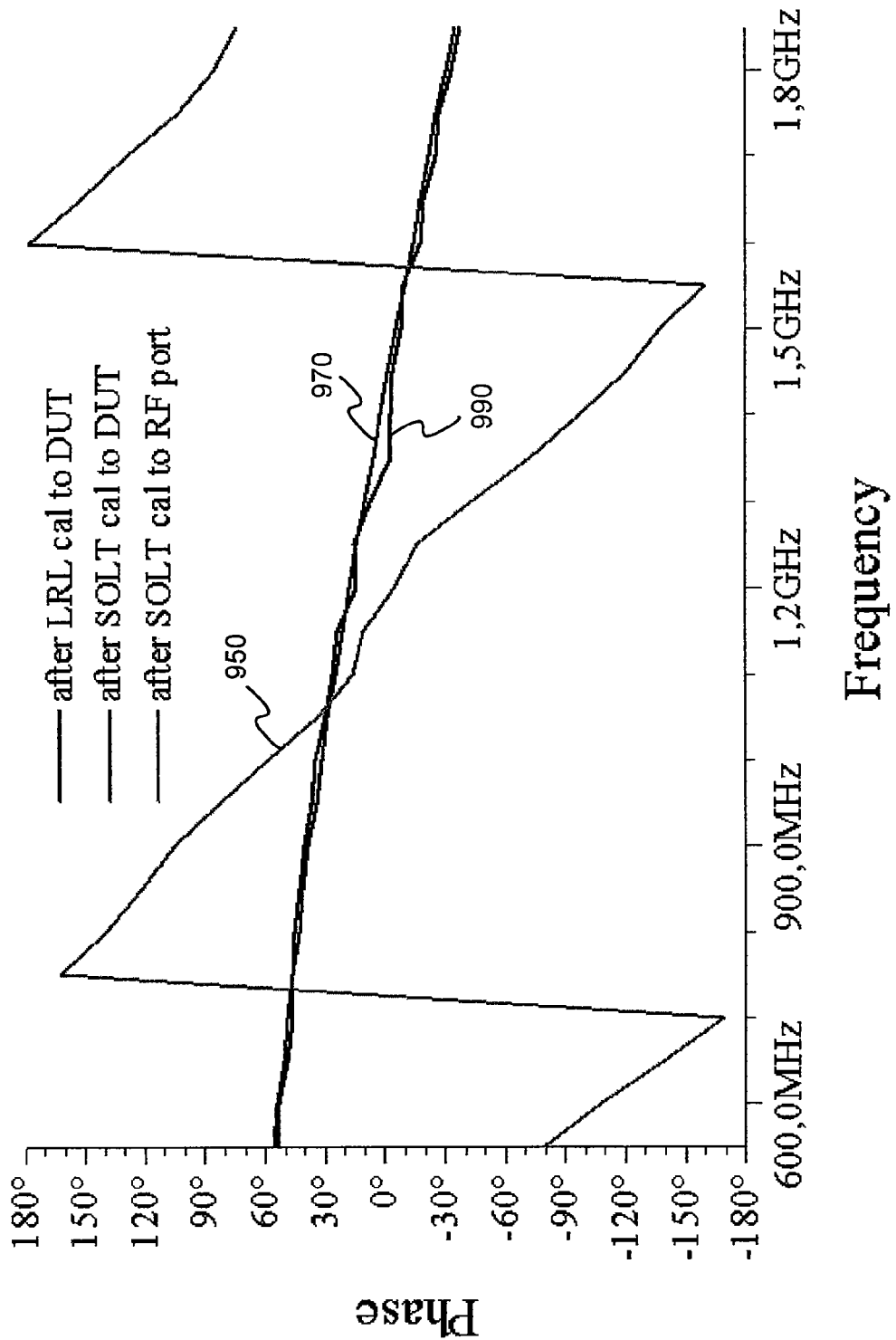
FIG. 19 is the measured $s_{11}$ phase response of the measurement system of FIG. 15 after SOLT calibration to the RF ports, after SOLT calibration to the DUT and after LRL calibration to the DUT.

Shown in FIGS. 18 and 19 are the magnitude and phase, respectively, of the $s_{11}$ of the DUT over a frequency range of 600 MHz to 1.8 GHz. Graphs 940 and 950 depict the magnitude and phase of $s_{11}$ after a standard SOLT calibration has been performed at the RF ports. Graphs 960 and 970 depict the magnitude and phase of $s_{11}$ after a SOLT calibration has been performed at the DUT. Graphs 980 and 990 depict the magnitude and phase of $s_{11}$ after the modified LRL calibration routine of one embodiment of the invention has been performed at the DUT. As can be seen by comparing Graphs 980 and 990 with 940 and 950, the measured magnitude and phase of $s_{11}$ after the modified LRL calibration routine has been performed at the DUT compares very favorably to the measured magnitude and phase of $s_{11}$ after a SOLT calibration at the DUT has been performed.

Figure 20:
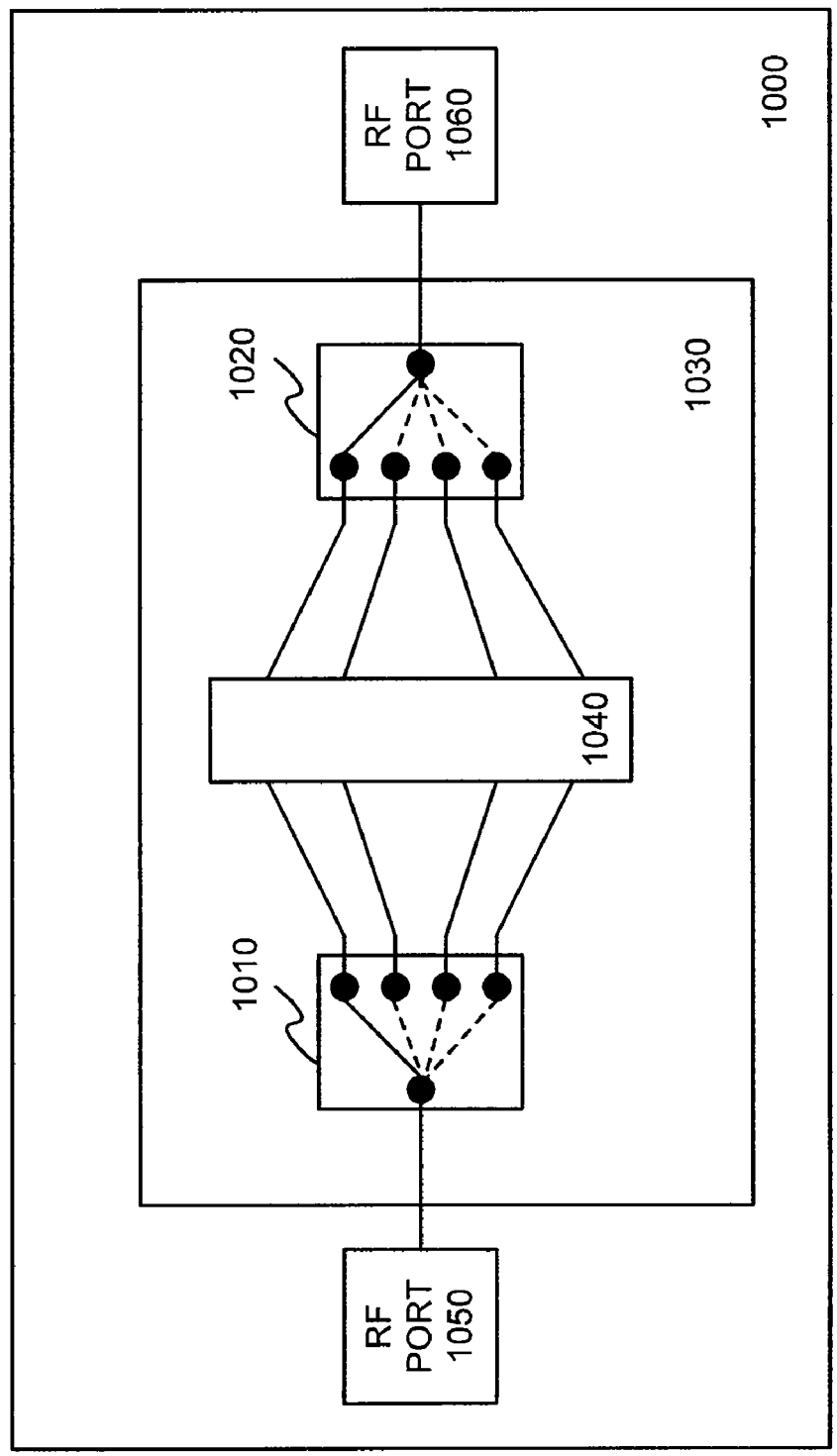
FIG. 20 is a block diagram of an ATE production tester with RF relays to connect multiple wafer probe needles to each RF test port used by one embodiment of the present invention.

Another aspect of the present invention involves a calibration method that allows calibration to the end of the probe needles when multiple probe needles share a RF port. FIG. 20 shows an ATE test head 1000 with RF relays 1010, 1020 on the load board 1030. Each RF relay connects an RF port to any one of multiple probe needles, each of which are connected to the DUT 1040. Calibrated measurements of s-parameters using any probe needle connected to RF port1 1050 and any probe needle connected to RF port2 1060 can be made.

During a calibration routine, a set of calibration factors are stored for each RF Port, one set for each position of the RF relay that connects a probe needle to the RF port. This enables the non-ideal behavior of the RF relay to be removed from the measurement path. When a s-parameter measurement is performed, the appropriate sets of correction factors are used to deembed the measurement to the ends of the two probe needles and define the measurement reference plane at the DUT pins being measured.

While the disclosed embodiments are described in specific terms, other embodiments encompassing principles of the invention are also possible. Further, operations may be set forth in a particular order. The order, however, is but one example of the way that operations may be provided. Operations may be rearranged, modified, or eliminated in any particular implementation while still conforming to aspects of the invention. Embodiments within the scope of the present invention also include computer readable media for carrying or having computer-executable instructions or data structures stored thereon. Such computer-readable media may be any available media that can be accessed by a general purpose or special purpose computer. By way of example, and not limitation, such computer-readable media can comprise RAM, ROM, EEPROM, DVD, CD ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications link or connection (either hardwired, wireless, or a combination of hardwired or wireless) to a computer, the computer properly views the connection as a computer-readable medium. Thus, any such a connection is properly termed a computer-readable medium. Combinations of the above should also be included within the scope of computer-readable media. Computer-executable instructions comprise, for example, instructions and data which cause a general purpose computer, special purpose computer, or special purpose processing device to perform a certain function or group of functions.

Those skilled in the art will appreciate that aspects of the invention may be practiced in network computing environments with many types of computer system configurations, including personal computers, hand-held devices, multi-processor systems, microprocessor based or programmable consumer electronics, network PCs, minicomputers, mainframe computers, and the like. Further, wirelessly connected cell phones, a type of hand-held device, are considered as within a network computing environment. For example, cell phones include a processor, memory, display, and some form of wireless connection, whether digital or analog, and some form of input medium, such as a keyboards, touch screens, etc. Examples of wireless connection technologies applicable in various mobile embodiments include, but are not limited to, radio frequency, AM, FM, cellular, television, satellite, microwave, WiFi, blue-tooth, infrared, and the like. Handheld computing platforms do not necessarily require a wireless connection. Aspects of the invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

We claim:

1. A method for radio frequency vector calibration of an automatic test equipment production tester including a plurality of wafer probes, each wafer probe having a plurality of wafer probe needles, each wafer probe needle including a tip, the method comprising:
   obtaining at least one reflect calibration standard and at least two line calibration standards on-wafer, each of the line calibration standards having an initially unspecified complex propagation constant and each having a different geometric length;
   measuring a delay value and a loss value of each line calibration standard;
   determining the complex propagation constant of each line calibration standard; and
   establishing a reference plane at the tips of the wafer probe needles without precise characterization of the reflect calibration standard.

2. The method of claim 1 wherein:
   the line calibration standards comprise a non-zero length thru calibration standard having a middle region and a second line calibration standard;
   the operation of measuring comprises performing a Thru-Reflect-Line calibration employing the on-wafer calibration standards; and
   the operation of establishing further comprises:
      setting the reference plane to the middle region of the first non-zero length thru calibration standard;
      determining an attenuation constant and a phase constant of the non-zero length thru calibration standard; and
      shifting the reference plane to the tips of the wafer probe needles based only on knowledge of the geometrical lengths of the line calibration standards used.

3. The method of claim 2 wherein the operation of shifting further comprises de-embedding the non-zero length thru calibration standard.

4. The method of claim 2 wherein the non-zero length thru calibration standard is implemented on a wafer using a microstrip.

5. The method of claim 4 wherein the wafer contains at least one device under test.

6. The method of claim 2 further comprising:
   obtaining a spacing between the tips of the wafer probe needles; and
   wherein the non-zero length thru calibration standard further comprises a microstrip with a length set to the spacing between the tips of the wafer probe needles.

7. The method of claim 2 wherein the operation of determining further comprises:
   obtaining a phase difference between the non-zero length thru calibration standard and a the second line calibration standard;
   obtaining a magnitude difference between the non-zero length thru calibration standard and the second line calibration standard;
   obtaining a geometrical length difference of the non-zero length thru calibration standard and the second line calibration standard; and
   wherein the attenuation constant is equal to the magnitude difference divided by the geometric length difference.

8. A computer readable medium containing computer executable instructions which, when executed, perform the method of claim 1.

9. An apparatus for performing calibrated device under test measurements, comprising:
   an automatic test equipment production tester, comprising:
      a test head having at least two radio frequency measurement ports; and
      a load board having a plurality of wafer probes, each wafer probe having a plurality of wafer probe needles, each wafer probe needle having a tip, operably connected to the test head and the device under test;
      a set of calibration standards that are configured to be accommodated without having to adjust spacing between the wafer probes;
      wherein the tester is calibrated to the tips of the wafer probe needles using the method of claim 1.

10. The method of claim 1, wherein the method further comprises:
   providing a first RF relay having a plurality of positions, each of the plurality of positions being configured to couple a first RF measurement port to a corresponding one of the plurality of wafer probe needles included in a first wafer probe.

11. The method of claim 10, wherein the method further comprises:
   providing a second RF relay having a plurality of positions, each of the plurality of positions being configured to couple a second RF measurement port to a corresponding one of the plurality of wafer probe needles included in a second wafer probe.

* * * * *